United States Patent Office 3,466,360
Patented Sept. 9, 1969

3,466,360

METHOD OF MAKING FREQUENCY-STABILIZED METAL-CLAD LAMINATES AND ARTICLE

George P. Chipman, Coshocton, Ohio, assignor to General Electric Company, a corporation of New York No Drawing. Filed Dec. 27, 1965, Ser. No. 516,769
Int. Cl. B32b *31/20, 15/08*
U.S. Cl. 264—346 10 Claims This invention relates to metal-clad plastics laminate structures. More particularly, it relates to such structures which are useful in microwave circuitry applications and which are especially characterized by good frequency response stability under operating conditions.

The use of metal-clad plastics laminates for printed circuit boards and particularly for use in microwave electronic applications is well known as where the metal cladding is selectively removed to enable the structure to serve the role of any of various electrical components such as resistors, capacitors and the like and also as the interconnecting circuit. Such boards are often known generically as strip transmission lines or, more simply, as strip lines.

In microwave applications the characteristics of any particular circuit are determined primarily by the thickness of the laminated structure and by its dielectric constant. The structures to be useful must be dimensionally stable, have very little water absorption, be possessed of a low dissipation factor, and have suitable physical strength and rigidity. It has been found that irradiated polyolefin materials such as polyethylene and the like are possessed of desirable characteristics for this purpose. It has also been found that blends and copolymers of olefins such as ethylene with other materials, such as butadiene and isobutylene, propylene, butenes, pentenes and the like are useful in this respect, as are blends or copolymers of the olefin with acrylonitrile, vinyl acetate and various acrylates. Typical of useful polyolefin materials are the polyethylenes known as Alathon produced by DuPont, DYNH produced by Bakelite and TR polyethylenes produced by Phillips Petroleum.

One method of making such circuit boards is to lay up a plastics laminate of thin films of irradiated polyolefin material and in the laminating operation itself, or in a separate step affixing the desired metal cladding, such as copper, to one or both sides of the laminate. According to another method of making such circuit boards, more particularly described in Canadian Patent 699,293, a slab of polyolefin is machined to a precise thickness dependent upon the particular characteristic desired. The slab of material is then irradiated in an effort to produce uniform characteristics throughout along with desirable physical properties and metal cladding affixed thereto. In order to relieve stresses set up in the board during its fabrication, it may be cycled one or more times between a relatively elevated temperature such as room temperature and a low temperature such as from −70° F. to about −320° F. A purpose of such treatment is to minimize physical deformity when the copper is removed from one or both sides of the laminate to form the desired electronic circuit.

In actual practice, microwave circuit boards formed in the above manner are occasionally exposed to and may be required to operate at temperatures ranging from about 0° F. to 150° F. and at frequencies ranging from about 1000 mc. to 10,000 mc. It is also required that the frequency shift of such completed circuits be held to a minimum because retuning after the circuit has been constructed and the board installed in place is time consuming, expensive, or impractical. It has been the experience that even during shipment a system comprising such circuit boards may very readily be subjected to temperatures which range from 0° to 150° F. not to mention such variation during actual operation. It has further been found that during such temperature cycling a permanent shift, or hysteresis, in the resonant frequency response of devices using such boards often results. This shift from the original frequency after temperature cycling, which is typically about 1.5 mc. at 1000 mc., cannot be tolerated. On the other hand, it has been found as a pratcical matter that a shift in frequency response at 1000 mc. of about 0.6 mc. permits the continued use of such equipment without returning. From the above it will be quite evident that there is a definite need for some means of stabilizing adequately the frequency response of microwave circuit boards.

Briefly, the present invention relates to the frequency response stabilization of microwave circuit boards by temperature cycling the metal-clad board from room temperature to a uniform elevated temperature below the incipient melting point of the polyolefin, then to about 0° F. and then to room temperature or about 70° F., the temperature cycling being repeated until the frequency change at microwave frequencies is at an acceptable minimum. Usually, holding the laminate at each temperature for about fifteen minutes is sufficient to attain that temperature uniformly throughout the structure. As a practical matter, heating the structure to about 150° F. is preferred although temperatures up to just below the incipient melting point of the polyolefin are also useful. Heating at temperatures of about 200° F. causes incipient melting and is to be avoided. When the upper temperature is about 100° F. or 125° F., a larger number of cycles is required.

Those features of the invention which are believed to be novel are set forth with particularity in the claims appended hereto. The invention will, however, be better understood and further objects and advantages thereof appreciated from a consideration of the following description.

While I do not wish to be bound by any particular theory as to how the present invention operates, it being sufficient that it does operate in a satisfactory manner, it is believed that the above described high temperature cycling stabilizes the thickness of the laminate within precise limits and to a much greater degree than is attained in previously described methods of achieving minimum physical deformity, and thereby stabilizes the frequency response of the structure.

The following examples will illustrate the present invention, it being realized that they are to be taken as exemplary only and not in the way of limitation. The materials in the examples were laid up using 1064 g. of polyethylene film having thicknesses of 5 mils, 11 mils and 13 mils which had been irradiated with a dosage of the order of 12 megaroentgens at about $10^6$ electron volts. Copper having a thickness of 0.0028 inch, known as 2-ounce copper since it weighs 2 ounces per sq. ft., was placed on either surface of the plastic lay-up and the composite structure pressed at a pressure of 400 p.s.i. at a temperature of 180° F. for five minutes to the final thickness shown in the table for a 15 inch by 19 inch laminate. The composite laminated structure was then cycled from room temperature to a temperature of −100° F., back to room temperature or 70° F., several times to dimensionally stabilize the laminate and remove internal stresses therefrom so that upon the removal of copper from one or both sides of the structure, it would tend to retain its flattened condition and not buckle or warp. Slabs of polyolefin material can also be used in lieu of the laminated structure.

The structures so treated were then cycled from room temperature to a uniform temperature of 150° F., to uniform room temperature, then to a uniform temperature of 0° F., and then to uniform room temperature, such treatment comprising one cycle. This stabilizing cycle was repeated until the desired thickness or frequency response stability was achieved. Shown in the table below are the results of the present temperature cycling on four typical examples prepared as above, the thickness of the structure before each cycle being shown along with the change in thickness after each cycle and the total change in thickness after six cycles.

| | Initial thickness (inches) | Cycle 1 | Change (inches) | Cycle 2 | Change (inches) | Cycle 3 | Change (inches) | Cycle 4 | change (inches) | Cycle 5 | Change (inches) | Cycle 6 | Change (inches) | Total Change (inches) |
|---|---|---|---|---|---|---|---|---|---|---|---|---|---|---|
| Example: | | | | | | | | | | | | | | |
| 1 | .2478 | .2493 | +.0015 | .2499 | +.0006 | .2506 | +.0001 | .2512 | +.0006 | .2514 | .0002 | .2514 | .0000 | +.0036 |
| 2 | .2508 | .2525 | +.0013 | .2531 | +.0006 | .2537 | +.0006 | .2539 | +.0002 | .2540 | .0001 | .2541 | .0001 | +.0033 |
| 3 | .2488 | .2503 | +.0015 | .2509 | +.0006 | .2516 | +.0007 | .2521 | +.0005 | .2522 | .0001 | .2522 | .0000 | +.0034 |
| 4 | .2494 | .2510 | +.0016 | .2517 | +.0007 | .2521 | +.0004 | .2525 | +.0004 | .2527 | .0002 | .2527 | .0000 | +.0031 |

From the above it will be noted that the thickness dimension of the laminates was substantially stabilized after the sixth cycle. When tested in an actual system at 1000 mc., it was found that the frequency change, as the temperature of the system varied from 0° F. to +150° F., ranged from about 0.3 mc. to about 0.6 mc., a variation which is well within usual design specifications.

Additional examples were before the above described temperature cycling first uniformly heated to a temperature of 212° F. It was found that such laminates with the described preheat followed by cycling as above had not become stabilized thickness-wise to a desired degree even after six cyclings, the change in frequency at 1000 mc. being over 1.5 mc. Other samples which were cycled from room temperature or 70° F. to 0° F. likewise did not become properly stabilized as to frequency and exhibited little or no change from one temperature cycling treatment to the next.

There is provided by the present invention means for stabilizing the frequency response to microwave circuit boards which will insure that systems constructed from such circuit boards operate at or about the tuned frequency without necessity for retuning.

What I claim as new and desire to secure by Letters Patent of the United States is:

1. The process of stabilizing the frequency response of a metal-clad cross-linked polyolefin structure which comprises cycling said structure though about six cycles or more between a uniform upper temperature just below the temperature at which incipient melting occurs and a uniform temperature of about 0° F. until said frequency response remains essentially constant.

2. A process as in claim 1 in which said upper temperature is about 150° F.

3. A process as in claim 1 in which said upper temperature is about 125° F.

4. A process as in claim 1 in which said metal is copper.

5. The product of the process of claim 1.

6. The process of stabilizing the frequency response of a metal-clad cross-linked polyolefin structure which comprises cycling said structure though about six cycles or more from about room temperature to a uniform upper temperature just below the incipient melting point of said polyolefin, to uniform room temperature, to a uniform temperature of about 0° F. and to uniform room temperature until said frequency response remains essentially constant.

7. A process as in claim 6 in which said upper temperature is about 150° F.

8. A process as in claim 6 in which said upper temperature is about 125° F.

9. A process as in claim 6 in which said metal is copper.

10. The product of claim 6.

References Cited

UNITED STATES PATENTS

| | | | |
|---|---|---|---|
| 2,434,541 | 1/1948 | Bierer | 156—80 |
| 2,990,580 | 7/1961 | Foster | 264—346 |
| 3,293,341 | 12/1966 | Boeke et al. | 264—346 |
| 3,318,758 | 5/1967 | Tell | 161—411 |
| 3,342,654 | 9/1967 | Golonka et al. | 156—85 |

JULIUS FROME, Primary Examiner

A. H. KOECKERT, Assistant Examiner

U.S. Cl. X.R.

156—85; 161—216, 411